(12) United States Patent
Liu et al.

(10) Patent No.: US 9,865,517 B2
(45) Date of Patent: Jan. 9, 2018

(54) TEST ELEMENT GROUP, ARRAY SUBSTRATE, TEST DEVICE AND TEST METHOD

(71) Applicant: BOE TECHNOLOGY GROUP CO., LTD., Beijing (CN)

(72) Inventors: Ying Liu, Beijing (CN); Hongwei Tian, Beijing (CN); Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/209,303

(22) Filed: Jul. 13, 2016

(65) Prior Publication Data

US 2017/0194222 A1    Jul. 6, 2017

(30) Foreign Application Priority Data

Dec. 31, 2015 (CN) .......................... 2015 1 1030280

(51) Int. Cl.
| | |
|---|---|
| *H01L 27/12* | (2006.01) |
| *H01L 21/66* | (2006.01) |
| *G02F 1/1368* | (2006.01) |
| *G02F 1/1362* | (2006.01) |

(52) U.S. Cl.
CPC ............ *H01L 22/34* (2013.01); *G02F 1/1362* (2013.01); *G02F 1/1368* (2013.01); *H01L 27/124* (2013.01); *G02F 2001/136254* (2013.01)

(58) Field of Classification Search
CPC ....................................................... H01L 22/34
See application file for complete search history.

(56) References Cited

U.S. PATENT DOCUMENTS

| | | | | |
|---|---|---|---|---|
| 4,819,038 A * | 4/1989 | Alt | ..................... | G01R 31/2656 257/10 |
| 4,820,222 A * | 4/1989 | Holmberg | .......... | G01R 31/2621 324/760.01 |
| 5,377,030 A * | 12/1994 | Suzuki | .................. | G02F 1/1309 324/71.3 |
| 5,546,013 A * | 8/1996 | Ichioka | .................. | G09G 3/006 324/760.02 |
| 6,028,442 A * | 2/2000 | Lee | ........................ | G09G 3/006 324/537 |
| 6,437,596 B1 * | 8/2002 | Jenkins | .................. | G09G 3/006 324/754.03 |
| 6,590,624 B1 * | 7/2003 | Lee | ..................... | G02F 1/13452 324/760.02 |
| 6,887,724 B2 * | 5/2005 | Nakamura | .............. | H01L 22/34 438/14 |

(Continued)

*Primary Examiner* — Evan Pert
(74) *Attorney, Agent, or Firm* — Harness, Dickey & Pierce, P.L.C.

(57) ABSTRACT

The present disclosure provides a test element group, an array substrate, a test device and a test method. The test element group includes an array of Thin Film Transistors (TFTs), in which first electrodes of the TFTs in each row are connected to a first connection end, second electrodes of the TFTs in each column are connected to a second connection end, and third electrodes of all of the TFTs in the array are connected to an identical third connection end. The first electrode, the second electrode and the third electrode correspond to the source electrode, the drain source and the gate source of the TFT.

19 Claims, 3 Drawing Sheets

(56) References Cited

U.S. PATENT DOCUMENTS

| | | | | |
|---|---|---|---|---|
| 7,525,118 B2* | 4/2009 | Nakamura | ............... | H01L 22/34 257/213 |
| 9,000,797 B2* | 4/2015 | Wen | ................... | G01R 31/2851 324/760.01 |
| 9,046,573 B1* | 6/2015 | Watt | ..................... | G06F 17/5045 |
| 9,171,869 B1* | 10/2015 | Gao | ....................... | H01L 27/124 |
| 2002/0079920 A1* | 6/2002 | Fujikawa | ............... | G02F 1/1309 324/754.07 |
| 2002/0085169 A1* | 7/2002 | Choi | ..................... | G02F 1/1309 349/192 |
| 2003/0049874 A1* | 3/2003 | Nakamura | ............... | H01L 22/34 438/18 |
| 2003/0204820 A1* | 10/2003 | Asano | .................... | G01R 31/30 324/762.09 |
| 2006/0270073 A1* | 11/2006 | Isobe | ................ | H01L 29/42384 438/17 |
| 2007/0146002 A1* | 6/2007 | Hsieh | ..................... | G09G 3/006 324/760.02 |
| 2007/0178614 A1* | 8/2007 | Arasawa | ................ | H01L 22/32 438/17 |
| 2008/0129327 A1* | 6/2008 | Kim | ...................... | G02F 1/1309 324/750.3 |
| 2010/0253656 A1* | 10/2010 | Fujikawa | .............. | G02F 1/1339 345/204 |
| 2010/0295567 A1* | 11/2010 | Chang | .................. | G01R 31/046 324/719 |
| 2013/0154679 A1* | 6/2013 | Chen | ...................... | G09G 3/006 324/754.1 |
| 2016/0379906 A1* | 12/2016 | Kim | ........................ | H01L 22/34 257/48 |
| 2016/0379907 A1* | 12/2016 | Ko | ........................... | H01L 22/34 257/48 |

* cited by examiner

TEST ELEMENT GROUP, ARRAY SUBSTRATE, TEST DEVICE AND TEST METHOD

CROSS-REFERENCE TO RELATED APPLICATION

The present disclosure claims a priority of the Chinese patent application No. 201511030280.1 filed on Dec. 31, 2015, which is incorporated herein by reference in its entirety.

TECHNICAL FIELD

The present disclosure relates to the field of a liquid crystal display (LCD), in particular to a test element group, an array substrate, a test device and a test method.

BACKGROUND

An array substrate of a display device is provided therein with Thin Film Transistors (TFTs), via which a display control is realized. After the array substrate is manufactured, a quality test on the TFTs should be performed in order to ensure a yield of the display device and facilitate a process control and a subsequent Failure Analysis (FA).

Regarding the test solution in related arts, a Test Element Group (TEG) is arranged on a non-display region of the array substrate. Similar as the TFT array in the display region, the TEG also includes a TFT array, but a connection end configured for test is connected to each of electrodes of each TFT. An operator may send test signals to or receives test signals from the TFT to be tested by enabling a probe on a test device to contact the connection end of the TFT to be tested. The operator can determine the TFT quality in the display region by testing the corresponding TFT in the TEG.

However, in a TEG structure in related arts, each of electrodes of a TFT corresponds to a connection end. When testing the whole TFT array, the operator has to control to move the probe all the time. Therefore, the above test method in related arts is inefficient and involves a large amount of work, and it is difficult for the operator to ensure an accurate positioning of the probe, or prevent from testing one TFT repeatedly.

SUMMARY

An object of the present disclosure is to provide a more efficient and convenient solution for the test element group.

In one aspect, the present disclosure provides in some embodiments a test element group including an array of TFTs, in which first electrodes of the TFTs in each row are connected to a first connection end, second electrodes of the TFTs in each column are connected to a second connection end, and third electrodes of all of the TFTs in the array are connected to an identical third connection end.

Alternatively, in the array of TFTs, the first electrode, the second electrode and the third electrode of each TFT are connected to a corresponding first connection end, a corresponding second connection end and a corresponding third connection end via metal leads respectively.

Alternatively, the third electrode is a gate electrode; and the first electrode and the second electrode are a drain electrode and a source electrode respectively, or the first electrode and the second electrode are the source electrode and the drain electrode respectively.

Alternatively, the third electrode is a source electrode; and the first electrode and the second electrode are a drain electrode and a gate electrode respectively, or the first electrode and the second electrode are the gate electrode and the drain electrode respectively.

Alternatively, the third electrode is a drain electrode; and the first electrode and the second electrode are a source electrode and a gate electrode respectively, or the first electrode and the second electrode are the gate electrode and the source electrode respectively.

In another aspect, the present disclosure provides in some embodiments an array substrate including the above test element group, and the test element group is at a region outside a display region of the array substrate.

In yet another aspect, the present disclosure provides in some embodiments a test device for the test element group, which includes a determination module configured to determine a TFT to be tested and a row number and a column number of the TFT in an array of TFTs; and a test module configured to test electrical parameters of the TFT through one of first connection ends corresponding to the row number, one of second connection ends corresponding to the column number and a third connection end.

Alternatively, the test module includes a first test sub-module, which includes first probes that are capable of electrically contacting the first connection ends in a one-to-one correspondence manner, wherein the first test sub-module is capable of testing the electrical parameters of the first electrode of the TFT by one of the first probes that electrically contacts the first connection end corresponding to the row number of the TFT; and a second test sub-module, which includes second probes that are capable of electrically contacting the second connection ends in the one-to-one correspondence manner, wherein the second test sub-module is capable of testing the electrical parameters of the second electrode of the TFT by one of the second probes that electrically contacts the second connection end corresponding to the column number of the TFT.

Alternatively, the test device further includes a third test sub-module, which includes a third probe that is capable of electrically contacting the third connection end, wherein the third test sub-module is capable of testing the electrical parameters of the third electrode of the TFT by the third probe that electrically contacts the third connection end.

Alternatively, the first test sub-module further includes a first logical switch configured to turn on the one of the first probes that electrically contacts the first connection end corresponding to the row number and turn off the other first probes; and the second test sub-module further includes a second logical switch configured to turn on the one of the second probes that electrically contacts the second connection end corresponding to the column number and turn off the other second probes.

Alternatively, the first logical switch includes a first decoder; and first relays that are connected in series to the first probes in a one-to-one correspondence manner, wherein an output end of the first decoder is connected to a control end of each of the first relays; and the second logical switch includes a second decoder; and second relays that are connected in series to the second probes in a one-to-one correspondence manner, wherein an output end of the second decoder is connected to a control end of each of the second relays.

In yet another aspect, the present disclosure provides in some embodiments a test method for the test element group, which includes steps: determining a TFT to be tested and a row number and a column number of the TFT in an array of TFTs; and testing electrical parameters of the TFT through one of first connection ends corresponding to the row number, one of second connection ends corresponding to the column number and a third connection end.

The technical solutions of the present disclosure has the following beneficial effect: in the technical solutions of the present disclosure, one type of electrodes of the TFTs of the test element group in an identical row are connected to a connection end, a second type of electrodes of the TFTs of the test element group in an identical column are connected to another connection end, and a third type of electrodes of the TFTs are connected to a connection end. When the test is performed, the operator only needs to position the probes at the connection ends corresponding to the row number and the column number of the TFT to be tested respectively, so as to send test signals to or receive test signals from the TFT to be tested. Compared with related arts, the solution of the present disclosure is much easier to be implemented, and the number of the connection ends required for the test element group may be greatly reduced.

DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

For solving the technical problem in related arts, the present disclosure provides a test element group and a corresponding test device, so as to select the TFT be tested in a more convenient manner, and thus perform the test.

Figure 1:
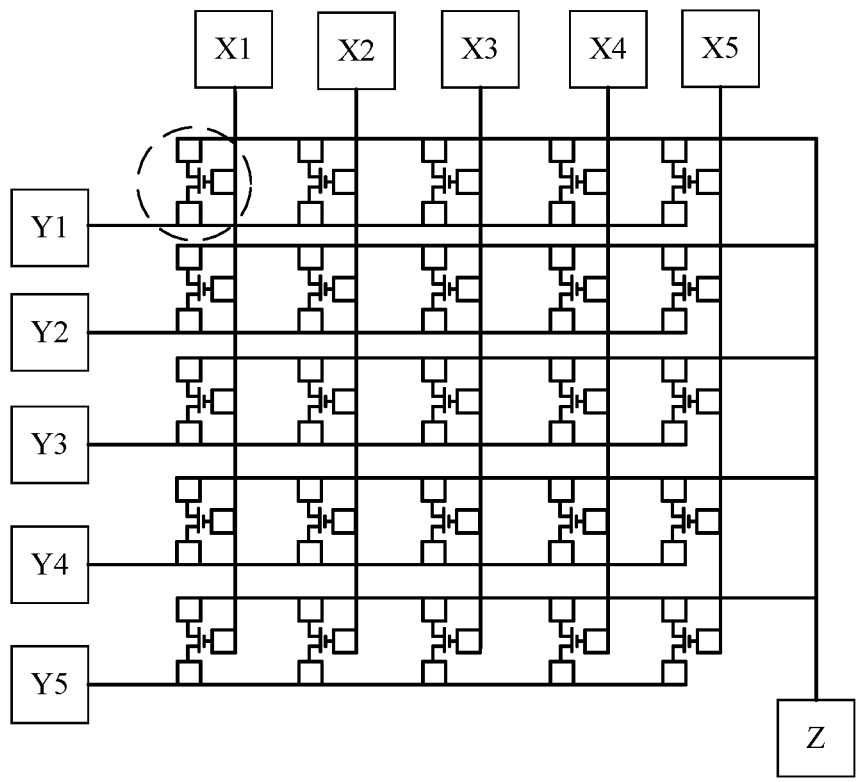
FIG. 1 is a schematic view showing a test element group according to embodiments of the present disclosure.

In one aspect, as shown in FIG. 1, a test element group includes an array of TFTs (one of which is indicated by a dashed circle in FIG. 1). In the array of TFTs, first electrodes of the TFTs in each row are connected to a first connection end (which is indicated by each of squares Y1-Y5 in FIG. 1), second electrodes of the TFTs in each column are connected to a second connection end (which is indicated by each of squares X1-X5 in FIG. 1), and third electrodes of all of the TFTs in the array are connected to an identical third connection end (which is indicated by square Z in FIG. 1).

It should be noted that, the first electrode, the second electrode and the third electrode may be selected from the source electrode, the drain electrode and the gate electrode of the TFT. That is, referring to FIG. 1, in this embodiment, all the drain electrodes of the TFTs can be connected to one connection end Z, or all the sources electrodes or gate electrodes of the TFTs are connected to one connection end Z.

In this embodiment, during a test of the test element group, it only requires to determine the row number and the column number of the TFT to be tested, and then electrical parameters of three types of electrodes of the TFT may be tested by the first connection end and the second connection end that correspond to the row number and the column number of the TFT respectively and the unique third connection end. Compared with the related arts, the number of the connection ends required for the test element group is greatly reduced, and as a result, the test complexity is effectively reduced.

Alternatively, in the test element group of this embodiment, the first electrode, the second electrode and the third electrode of each TFT are connected to a corresponding first connection end, a corresponding second connection end and a corresponding third connection end via metal leads of low impedance respectively, so as to reduce the influence of the leads on the test result.

Figure 2:
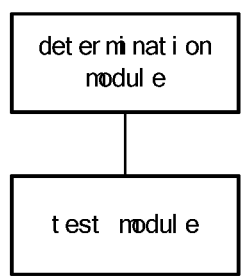
FIG. 2 is a schematic view showing a test device according to embodiments of the present disclosure.

Alternatively, as shown in FIG. 2, the test device includes a determination module configured to determine a TFT to be tested and a row number and a column number of the TFT in an array of TFTs; and a test module configured to test electrical parameters of the TFT through one of first connection ends corresponding to the row number, one of second connection ends corresponding to the column number and the third connection end.

In this embodiment, the test device may perform the test on the test element group in a quick manner. For example, as shown in FIG. 1, in order to test the TFT in the second row and in the third column, the connection ends Y2, X3 and Z may be selected, so as to apply the test signals to the three electrodes of the TFT. If the TFT in the third row three and in the fourth column is the next one to be tested, it is merely required to reselect the connection ends Y3 and X4, while the selection of the connection end Z remains.

Specifically, the test device sends measurement signals to or receives measurement signals from the TFT through the probe.

The test module further includes a first test sub-module, which has first probes that are capable of electrically contacting the first connection ends in a one-to-one correspondence manner, wherein the first test sub-module is capable of testing the electrical parameters of the first electrode of the TFT by one of the first probes that electrically contacts the first connection end corresponding to the row number of the TFT; a second test sub-module, which has second probes that are capable of electrically contacting the second connection ends in the one-to-one correspondence manner, wherein the second test sub-module is capable of testing the electrical parameters of the second electrode of the TFT by one of the second probes that electrically contacts the second connection end corresponding to the column number of the TFT; and a third test sub-module, which includes a third probe that is capable of electrically contacting the third connection end, wherein the third test sub-module is capable of testing the electrical parameters of the third electrode of the TFT by the third probe that electrically contacts the third connection end.

As a result, the test device may move from one TFT to be tested to another TFT to be tested without moving the probe. A detailed description is as follows.

Figure 3:
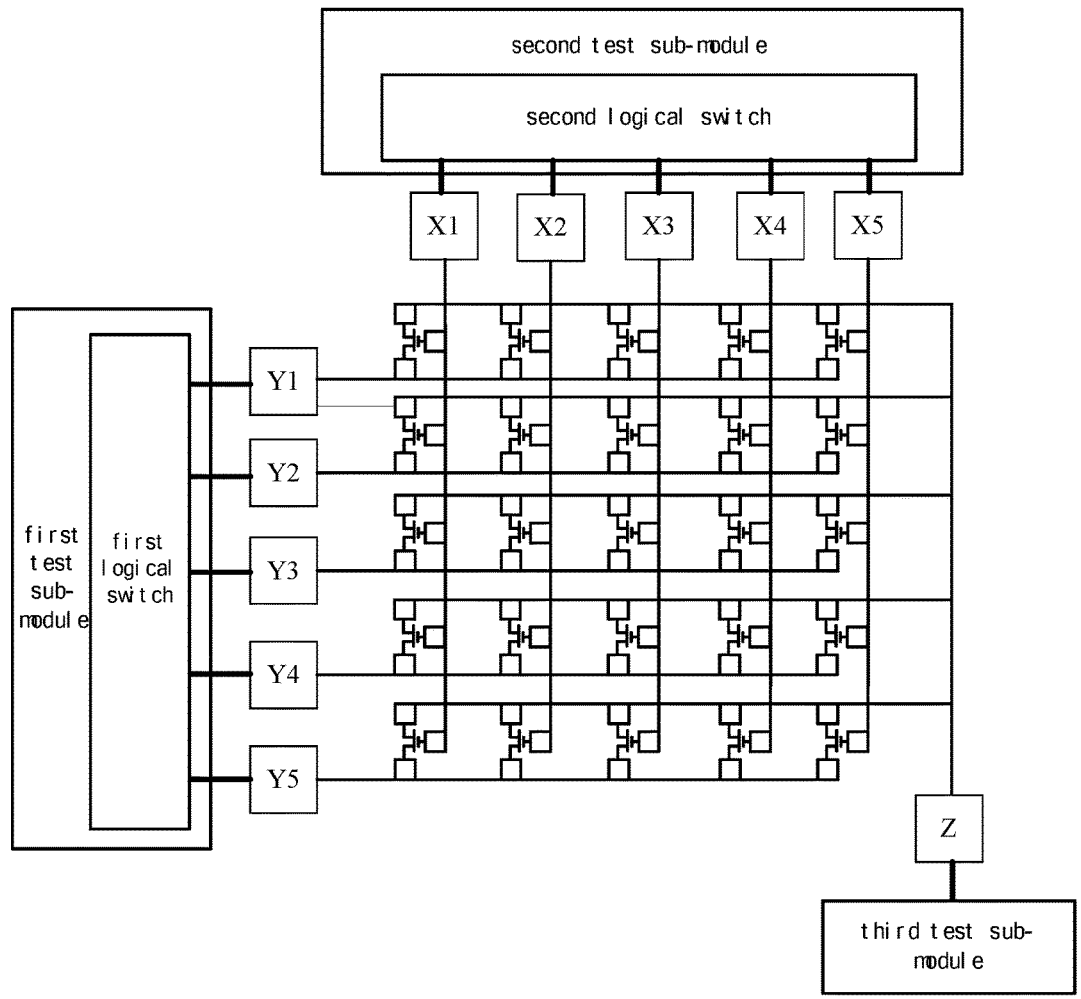
FIG. 3 is a schematic view showing an application of the test device on the test element group.

Referring to FIG. 3, in this embodiment, the first test sub-module further includes a first logical switch configured to turn on the one of the first probes that electrically contacts the first connection end corresponding to the row number of the TFT and turn off the other first probes; and the second test sub-module further includes a second logical switch configured to turn on the one of the second probes that electrically contacts the second connection end corresponding to the column number of the TFT and turn off the other second probes.

For example, the TFT in the fourth row and in the second column of FIG. 3 is to be tested. After the first probes in the first test sub-module electrically contact the first connection ends Y1-Y5 respectively, the first logical switch turns on the first probe that electrically contact the first connection end Y4, and then the first test sub-module sends the measurement signals to or receive the measurement signals from the first electrodes of all the TFTs in the fourth row. Likewise, after the second probes in the second test sub-module electrically contact the second connection ends X1-X5 respectively, the second logical switch turns on the second probe that electrically contact the second connection end X2, and then the second test sub-module sends the measurement signals to or receive the measurement signals from the second electrodes of all the TFTs in the second column. The third test sub-module directly sends the measurement signals to or receives the measurement signals from the third electrodes of all the TFTs through the connection end Z. In the whole array, only the three electrodes of the TFT in the fourth row and in the second column can be electrically connected to the test device so as to perform the test on the TFT. As can be seen, based on the above principle, upon moving to another TFT to be tested, the first logical switch and the second logical switch only need to control an electrical connection between the probe and the connection end. It is not necessary for the operator to move the probe manually; and thus the test efficiency and the test accuracy are remarkably improved.

Figure 4:
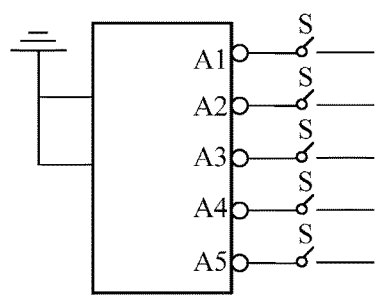
FIG. 4 is a schematic view of a logical switch used by the test device according to embodiments of the present disclosure.

Specifically, during actual uses, decoders and relays can function as the logical switches. For example, as shown in FIG. 4, it is assumed that the decoder includes five output pins A1-A5 each capable of outputting potentials "0" and "1", and each output pin is connected to a corresponding probe through a relay switch S, wherein the relay switch S is usually turned off, and is turned on upon being applied a high potential "1". In the present disclosure, the probe may be turned on and turned off by controlling the decoder to output a high or low potential to the corresponding output pin.

Therefore, the first logical switch in this embodiment may include: a first decoder; and first relays that are connected in series to the first probes in a one-to-one correspondence manner, wherein an output end of the first decoder is connected to a control end of each of the first relays; and the second logical switch may include: a second decoder; and second relays that are connected in series to the second probes in a one-to-one correspondence manner, wherein an output end of the second decoder is connected to a control end of each of the second relays.

Hereafter, an implementation of the test solution of the present disclosure is described in details.

Figure 5:
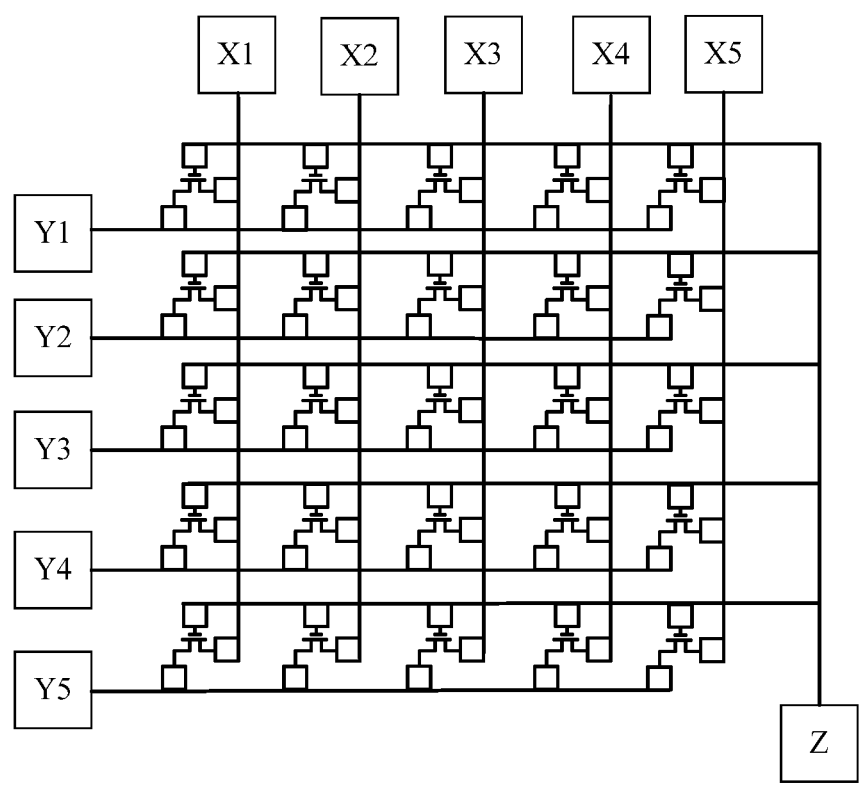
FIG. 5 is another schematic view showing a test element group according to embodiments of the present disclosure.

As shown in FIG. 5, it is assumed that the test element group includes an array of TFTs with five rows and five columns. The drain electrodes of the TFTs in each row are connected to a connection end, and the drain electrodes correspond to a Y axis of a coordinate system, and the connection ends of the drain electrodes correspond to coordinate values Y1-Y5 in accordance with the row numbers respectively. Likewise, the source electrodes of the TFTs in each column are connected to a connection end, and the source electrodes may correspond to an X axis of the coordinate system, and the connection ends of the source electrodes correspond to coordinate values X1-X5 in accordance with the column numbers respectively. The gate electrodes of all the TFTs are connected to a connection end Z.

It should be noted that, during actual uses, all of the above connection ends may be provided within one region. For the test device, all of the probes may be provided on an add-in card. When the test is performed, the add-in card is plugged at a region for the connection ends corresponding to the test element group, so that the probes may electrically contact the connection ends. Afterwards, the TFT to be tested is may be selected by programming control, so as to turn on the first probe and the second probe corresponding to the coordinate values (X, Y) of the TFT to be tested as well as the third probe corresponding to the connection end Z. After it is determined the probes match the connection ends, the source electrode, the gate electrode and the drain electrode of the TFT may be tested by these three probes.

Since the gate electrodes of all the TFTs are connected, the third probe on the test device may apply a same potential to all the gate electrodes, so as to prevent leakage of electricity at the gate electrodes which may otherwise adversely affect the test result.

As a result, in the technical solution of the present disclosure, the complexity of the test on the TFT may be significantly reduced.

In addition, the present disclosure provides in some embodiments an array substrate including the test element group, wherein the test element group is provided at a position outside a display region of the array substrate. During the process of manufacturing the array substrate, the TFT array in the display region and the TFT array on the test element group are simultaneously manufactured, and the quality of the TFTs on the display region can be determined by testing the TFTs on the test element group.

In addition, in another embodiment, the present disclosure also provides a test method for the test element group, which includes steps of: determining a TFT to be tested and a row number and a column number of the TFT in an array of TFTs; and testing electrical parameters of the TFT through one of first connection ends corresponding to the row number, one of second connection ends corresponding to the column number and a third connection end.

As can be seen, the test method in the embodiment corresponds to the test device according to the present disclosure. The technical effect that is realized by the test device also can be realized by the test method of the present disclosure.

The above are merely the optional embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A test device for a test element group, wherein the test device comprises:
   a determination module configured to determine a Thin Film Transistors (TFT) to be tested and a row number and a column number of the TFT in an array of TFTs, wherein the test element group comprises the array of TFTs, in which first electrodes of the TFTs in each row are connected to a first connection end, second electrodes of the TFTs in each column are connected to a second connection end, and third electrodes of all of the TFTs in the array of TFTs are connected to an identical third connection end; and
   a test module configured to test electrical parameters of the TFT to be tested through one of first connection ends corresponding to the row number, one of second connection ends corresponding to the column number and a third connection end.

2. The test device according to claim 1, wherein in the array of TFTs, the first electrode, the second electrode and the third electrode of each TFT are connected to a corresponding first connection end, a corresponding second connection end and the third connection end via metal leads respectively.

3. The test device according to claim 1, wherein
   the third electrode is a gate electrode; and
   the first electrode and the second electrode are a drain electrode and a source electrode respectively, or the first electrode and the second electrode are the source electrode and the drain electrode respectively.

4. The test device according to claim 1, wherein
   the third electrode is a source electrode; and
   the first electrode and the second electrode are a drain electrode and a gate electrode respectively, or the first electrode and the second electrode are the gate electrode and the drain electrode respectively.

5. The test device according to claim 1, wherein
   the third electrode is a drain electrode; and
   the first electrode and the second electrode are a source electrode and a gate electrode respectively, or the first electrode and the second electrode are the gate electrode and the source electrode respectively.

6. A test device for a test element group comprised in an array substrate, wherein the test element group is at a region outside a display region of the array substrate, the test device comprising:
   a determination module configured to determine a Thin Film Transistors (TFT) to be tested and a row number and a column number of the TFT in an array of TFTs, wherein the test element group comprises the array of TFTs, in which first electrodes of the TFTs in each row are connected to a first connection end, second electrodes of the TFTs in each column are connected to a second connection end, and third electrodes of all of the TFTs in the array of TFTs are connected to an identical third connection end; and
   a test module configured to test electrical parameters of the TFT to be tested through one of first connection ends corresponding to the row number, one of second connection ends corresponding to the column number and a third connection end.

7. The test device according to claim 6, wherein in the array of TFTs, a first electrode, a second electrode and a third electrode of each TFT are connected to a corresponding first connection end, a corresponding second connection end and the third connection end via metal leads respectively.

8. The test device according to claim 6, wherein
   the third electrode is a gate electrode; and
   the first electrode and the second electrode are a drain electrode and a source electrode respectively, or the first electrode and the second electrode are the source electrode and the drain electrode respectively.

9. The test device according to claim 6, wherein
   the third electrode is a source electrode; and
   the first electrode and the second electrode are a drain electrode and a gate electrode respectively, or the first electrode and the second electrode are the gate electrode and the drain electrode respectively.

10. The test device according to claim 6, wherein
    the third electrode is a drain electrode; and
    the first electrode and the second electrode are a source electrode and a gate electrode respectively, or the first electrode and the second electrode are the gate electrode and the source electrode respectively.

11. The test device according to claim 1, wherein the test module comprises:
    a first test sub-module comprising first probes that are capable of electrically contacting the first connection ends in a one-to-one correspondence manner, wherein the first test sub-module is capable of testing the electrical parameters of the first electrode of the TFT by one of the first probes that electrically contacts the first connection end corresponding to the row number of the TFT; and
    a second test sub-module comprising second probes that are capable of electrically contacting the second connection ends in the one-to-one correspondence manner, wherein the second test sub-module is capable of testing the electrical parameters of the second electrode of the TFT by one of the second probes that electrically contacts the second connection end corresponding to the column number of the TFT.

12. The test device according to claim 11, the test module further comprises:
    a third test sub-module comprising a third probe that is capable of electrically contacting the third connection end, wherein the third test sub-module is capable of testing the electrical parameters of the third electrode of the TFT by the third probe that electrically contacts the third connection end.

13. The test device according to claim 11, wherein
    the first test sub-module further comprises: a first logical switch configured to turn on the one of the first probes that electrically contacts the first connection end corresponding to the row number and turn off the other first probes; and
    the second test sub-module further comprises: a second logical switch configured to turn on the one of the second probes that electrically contacts the second connection end corresponding to the column number and turn off the other second probes.

14. The test device according to claim 13,
the first logical switch comprises: a first decoder; and first relays that are connected in series to the first probes in a one-to-one correspondence manner, wherein an output end of the first decoder is connected to a control end of each of the first relays; and
the second logical switch comprises: a second decoder; and second relays that are connected in series to the second probes in a one-to-one correspondence manner, wherein an output end of the second decoder is connected to a control end of each of the second relays.

15. The test device according to claim 3, wherein in the array of TFTs, a first electrode, a second electrode and a third electrode of each TFT are connected to a corresponding first connection end, a corresponding second connection end and the third connection end via metal leads respectively.

16. The test device according to claim 7, wherein
the third electrode is a gate electrode; and
the first electrode and the second electrode are a drain electrode and a source electrode respectively, or the first electrode and the second electrode are the source electrode and the drain electrode respectively.

17. The test device according to claim 2, wherein
the third electrode is a source electrode; and
the first electrode and the second electrode are a drain electrode and a gate electrode respectively, or the first electrode and the second electrode are the gate electrode and the drain electrode respectively.

18. The test device according to claim 2, wherein
the third electrode is a drain electrode; and
the first electrode and the second electrode are a source electrode and a gate electrode respectively, or the first electrode and the second electrode are the gate electrode and the source electrode respectively.

19. A test method for a test element group, wherein the test element group comprises an array of Thin Film Transistors (TFTs), in which first electrodes of the TFTs in each row are connected to a first connection end, second electrodes of the TFTs in each column are connected to a second connection end, and third electrodes of all of the TFTs in the array are connected to an identical third connection end, the test method comprising steps of:
determining a TFT to be tested and a row number and a column number of the TFT to be tested in the array of TFTs; and
testing electrical parameters of the TFT to be tested through one of first connection ends corresponding to the row number, one of second connection ends corresponding to the column number and a third connection end.

* * * * *